United States Patent [19]
Sims, Jr.

[11] Patent Number: 5,402,500
[45] Date of Patent: Mar. 28, 1995

[54] ADAPTIVE PROPORTIONAL GAIN AUDIO MIXING SYSTEM

[75] Inventor: Travis M. Sims, Jr., Rio Rancho, N. Mex.

[73] Assignee: Lectronics, Inc., Rio Rancho, N. Mex.

[21] Appl. No.: 91,317

[22] Filed: Jul. 14, 1993

Related U.S. Application Data

[63] Continuation-in-part of Ser. No. 62,430, May 13, 1993.

[51] Int. Cl.$^6$ .............................................. H04B 1/00
[52] U.S. Cl. ..................................... 381/119; 381/108
[58] Field of Search ................... 381/119, 92, 94, 107, 381/108, 57; 379/202, 389, 390

[56] References Cited

U.S. PATENT DOCUMENTS 4,466,119  8/1984  Peters et al. ..................... 381/108

*Primary Examiner*—Curtis Kuntz
*Assistant Examiner*—Mark D. Kelly
*Attorney, Agent, or Firm*—McCubbrey, Bartles & Ward

[57] ABSTRACT

An improved audio mixing system. The system is not limited to one type of microphone and does not depend on separate sensing microphones to determine the background noise level. In addition, the active signal is not amplitude modulated by extraneous noise inputted through inactive microphones. The mixing system divides the system gain between a plurality of input channels. The mixing system periodically samples the channels and determines which channel is the dominant channel. In response to this determination, the gain of the dominant channel is increased and that of the other channels decreased.

3 Claims, 1 Drawing Sheet

ADAPTIVE PROPORTIONAL GAIN AUDIO MIXING SYSTEM

This application is a continuation-in-part of U.S. patent application Ser. No.: 08/062,430, filed May 13, 1993.

FIELD OF THE INVENTION

The present invention relates to audio mixing systems, and more particularly, to electronic systems for controlling audio sound reinforcement systems employing multiple microphones, as might be found in conference rooms, churches, auditoriums, and the like.

BACKGROUND OF THE INVENTION

Consider a conference room in which a number of talkers, each with a separate microphone, are to speak. If all of the microphones are allowed to be active at the same time, problems associated with feedback and extraneous noise pickup arise. Each active microphone that is not actually being used picks up the amplified sounds from the microphone that is being used by the current talker. As a result, the amount of amplification available to the talker's microphone must be reduced to prevent feedback. In addition, each active microphone acts as a noise source that further reduces the quality of the audio from the microphone that is actually being used by the current talker. Finally, destructive interference from reinforced sound recirculated through the sound system from multiple open microphones (commonly known as "comb filtering") can cause serious aberrations in the system frequency response.

To avoid these problems, a number of prior art systems have been devised to activate only those microphones in which there exists some desired signal. One class of prior art system uses the sound level at each microphone to determine whether that microphone should be on or off. Some of the systems (e.g. Scrader, U.S. Pat. No. 4,090,032, Peters, U.S. Pat. No. 4,149,032, and Ponto and Martin, U.S. Pat. No. 4,374,300) compare the instantaneous signal level at any microphone to a reference. If the microphone level exceeds the reference level, the microphone is assumed to have a desired signal and is turned on. Systems of this type typically modulate the reference in some manner that is proportional to the current active signal level to prevent other microphones from coming on as a result of pickup of sound from the system loudspeakers. Often, systems of this type change the attenuation level of the microphone channel from the off state to the on state in an instantaneous manner, which can give rise to audible switching transients not harmonically related to the audio signal. In addition, a single initial value of the reference threshold may not accurately reflect the changes in ambient noise in an acoustic space under varying conditions of use.

Other types of systems (e.g. Anderson, Bevan, Schulein, and Smith, U.S. Pat. No. 4,489,442 and Dugan, U.S. Pat. No. 3,814,856) develop a reference level based on a sensing microphone of some type. In the case of Anderson et al., two directional microphones are placed back-to-back in a common housing. One of the microphones is the system microphone, while the other is the sensing microphone. The system microphone is oriented so as to preferentially pick up the desired sound, while the sensing microphone is oriented to pick up the background sounds. The signal at the system microphone must exceed the level at the sensing microphone by 9.54 dB to activate the system microphone. While this system solves the reference threshold problem, there are still drawbacks. The system again switches from the attenuated level to the unattenuated level instantaneously which leads to the difficulties discussed above. In addition, the system is restricted to the use of only specially manufactured microphones, eliminating the choice of other microphones whose characteristics might be better suited to the particular application.

The Dugan system, in contrast, uses a single sensing microphone situated in such a way so as to receive a signal that is representative of the ambient noise in the room. The effective threshold for other microphones is proportional to the instantaneous signal value at the sensing microphone. Also, rather than changing channel gain in an instantaneous manner, the shift from fully attenuated to fully on happens over a 10 dB range above threshold. This is accomplished via 2:1 expansion, i.e. for every 1 dB that the microphone signal exceeds the threshold, channel gain increases 1 dB up to a total of 10 dB gain change, at which time the channel reaches unity gain. Difficulties in the use of this system arise in finding an appropriate place for the sensing microphone that accurately reflects the ambient noise in the entire space. In addition, a localized increase in the ambient noise near the sensing microphone can prevent activation of microphones which have desired signals.

In another system (Dugan, U.S. Pat. No. 3,992,584), a comparison is made of the level at each microphone preamp to the level of the overall mixed signal. Each channel is attenuated by an amount that depends on the difference between the two levels. For instance, if one microphone were active, the level of that microphone and the level of the overall mix would be equal (i.e. a difference of 0 dB), so that the channel would not be attenuated. All other channels would be very much attenuated because of the large difference between the mix level and the level of an inactive microphone. If two microphones are active at the same level, the mix level (assuming no correlation between the two inputs) will be 3 dB higher than either active input. Thus, both microphones would be attenuated by 3 dB (and again inactive microphones would be greatly attenuated as before). The drawback to the Dugan scheme is that extraneous noise (whether recirculated signals from the sound system or other noise) at "inactive" microphones will compete with the active microphone for system gain. In this way, the "active" signal is amplitude modulated by the extraneous noise.

In the above-cited U.S. patent application, a system that substantially improves on systems of the type taught in the '584 patent is disclosed. In that invention, the audio mixing system, combines a plurality of input signals to generate a mixed signal. The mixing system includes a plurality of input channels. Each input channel includes an input circuit for receiving an input signal, and a variable attenuator for generating an attenuated signal from the input signal. The output signal is obtained by combining the attenuated signals. The level of attenuation applied to each channel is determined by the average values of the input signals and the attenuated signals over a predetermined time interval.

While the above described system is a substantial improvement over the art that preceded it, improvements in three areas are still desirable. First, "bleedover" from talkers at adjacent microphones when the microphones are closely spaced together is a problem.

For example in conference room settings, inactive microphones tend to come on as a result of bleed-over from a talker at an adjacent microphone. The problem increases as the talker moves further away from the desired microphone.

Second, determination of the active microphone in high ambient noise settings is often difficult. In such settings, inactive microphones can compete for system gain based solely on the ambient noise Being received by the inactive microphone.

Finally, it is advantageous to maintain the gain of the last active microphone. In the absence of some mechanism for maintaining the gain of the active microphone, gain deviations arising from pauses in speech or changes in the background noise level often occur.

Broadly, it is the object of the present invention to provide an improved audio mixing system.

It is a further object of the present invention to provide a mixing system that is more immune to bleed-over from adjacent microphones.

It is a still further object of the present invention to provide a mixing system that performs better in high ambient noise situations than prior art mixing systems.

It is yet another object of the present invention to provide a mixing system that maintains the gain of the last active microphone during pauses in the talkers speech.

These and other objects of the present invention will become apparent to those skilled in the art from the following detailed description of the invention and the accompanying drawings.

SUMMARY OF THE INVENTION

The present invention is an audio mixing system for combining a plurality of input signals to generate a mixed signal. The mixing system includes a plurality of input channels. Each input channel includes an input circuit receiving an input signal, and a variable attenuator for generating an attenuated signal from the input signal. The output signal is obtained by combining the attenuated signals. The level of attenuation applied to each channel is determined by the average values of the input signals and the attenuated signals over a first predetermined time interval. In one embodiment of the present invention, the attenuation levels are set by generating a channel signal corresponding to each input channel, the channel signal depending on the input signal received by the channel and the attenuated signal generated by said input channel. The ratio of the channel signal for a given channel to the sum of the channel signals for all channels is used to set the attenuation for the channel in question in this embodiment.

DETAILED DESCRIPTION OF THE INVENTION

Figure 1:
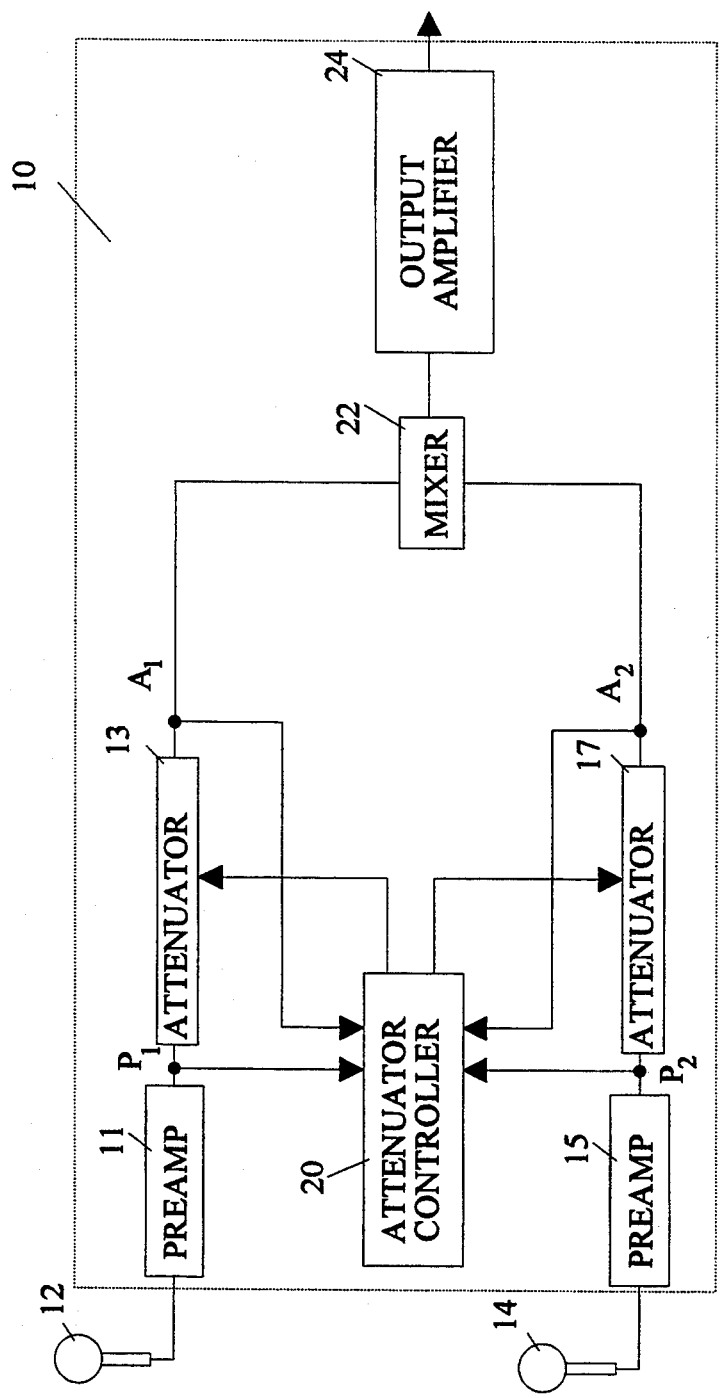
FIG. 1 is a block diagram of a two channel audio mixing circuit according to the present invention.

Refer now to FIG. 1 which is a block diagram of a two channel audio mixing circuit 10 according to the present invention. The first channel includes a preamp 11 and attenuator 13 for amplifying the output of a first microphone 12. The second channel includes a preamp 15 and attenuator 17 for amplifying the output of a second microphone 14. The outputs of attenuators 13 and 17 are input to a mixer 22 which feeds output amplifier 24. Mixer 22 adds the outputs of attenuators 13 and 17 in a fixed ratio. The amount of attenuation applied by attenuators 13 and 17 is determined by controller 20 which senses the output of preamps 11 and 15 as well as attenuators 13 and 17 and then generates a control signal that is applied to each of the attenuators. Denote the average output of preamp 11 by P1 and the average output of preamp 15 by P2. The manner in which the "average" output of each preamp is generated will be discussed in more detail below.

In the embodiments of the invention described in U.S. patent application Ser. No.: 08/062,430 which is hereby incorporated by reference, each channel's gain is determined by the ratio of a chapel signal associated with the channel and the sum of all of the channel signals. In the preferred embodiment of the invention described in the patent application in question, the channel signal is a mixture of the preamplified microphone signal and the post-attenuator microphone signal. Denote the average post-attenuator 13 signal by $A_1$ and the average post-attenuator 17 signal by $A_2$. In the preferred embodiment of the present invention, controller 20 sets the level of attenuator 13 to $L_1$ where $$L_1 = 20 \log_{10} \left[ \frac{P_1^*(1 - x_1) + A_1^* x_1}{S_t} \right] \quad (1)$$

and the level of attenuator 17 to $L_2$ where $$L_2 = 20 \log_{10} \left[ \frac{P_2^*(1 - x_2) + A_2^* x_2}{S_t} \right] \quad (2)$$

Here, $$S_t = P_1^*(1-x_1) + A_1^* x_1 + P_2^*(1-x_2) + A_2^* x_2 \quad (3)$$

where $x_1$ and $x_2$ may have values from 0 to 1 inclusive.

It will be apparent to those skilled in the art that this system may be generalized to systems having N channels, where N is any integer greater than 1. In this case, the attenuator in the $i^{th}$ channel has a level, $L_i$, given by $$L_i = 20 \log_{10} \left[ \frac{P_i^*(1 - x_i) + A_i^* x_i}{S_t} \right] \quad (4)$$

where $$S_t = \sum_{i=1}^{N} [P_i^*(1 - x_i) + A_i^* x_i] \quad (5)$$

In the system described in the above-identified patent application, the time interval over which the averaging takes place is determined by the cut-off of a low-pass filter. The output of a low-pass filter preferably tracks the voice envelope of the person speaking while removing any ripple resulting from the fundamental frequency. The preferred filter provides a "fast attack"-"slow release" filter. The fast attack characteristic assures that the initial syllables uttered by the talker are not lost.

The present invention provides its improvements over the invention taught in the patent application described above by having controller 20 vary the value of x in response to the longer term behavior of the channels. At any given time, the attenuators shown in FIG. 1 are controlled as described above. By varying the $x_i$ values, the signal contribution of the active microphone is skewed toward its pre-attenuator signal, while the signal contribution of all other microphones are skewed toward their post-attenuator signal values. As a result, a small actual signal level difference between a group of closely spaced microphones is effectively increased. This results in improved immunity to the bleed-over problems discussed above.

Finally, maintaining the gain of the last active microphone reduces gain deviations during pauses in speech. As will be discussed in more detail below, the last active microphone will remain active if the speaker stops speaking and the noise level at each microphone is the same.

In the present invention, a channel signal is defined for each channel, the signal corresponding to the $i^{th}$ channel being denoted by $S_i$, for $i = 1 \ldots N$. Here N is the number of channels in the mixer. In the preferred embodiment of the present invention, $$S_i = P_i^*(1-x_i) + A_i^* x_i \tag{6}$$

The channel for which $S_i$ is maximum will be referred to as the dominant channel. The present invention measures the fraction of the time each channel is the dominant channel during a predetermined time period referred to as the window time period in the following discussion. Controller 20 then adjusts the values of $x_i$ based on the fraction of the time that each channel was the dominant channel during the proceeding window time period. The window time period in question is preferably between 0.1 seconds and 1 second. The $x_i$ values are constrained between 0 and some predetermined upper bound. In the preferred embodiment of the present invention, the upper bound is 0.6.

One method for making the adjustments is to periodically adjust the $x_i$ as follows. When the mixer is turned on, all of the $x_i$ are set to 0.6. During the predetermined time period, the $S_i$ values are sampled a number of times. Each time the $S_i$ values are sampled, the channel having the greatest $S_i$ value is determined and a counter corresponding to that channel is incremented. At the end of the time period, controller 20 determines which counter has the maximum number of counts. This channel will be referred to as the dominant channel over the window time period. Denote this channel's channel number by k. Controller 20 then decreases $x_k$ and increases $x_i$ for all $i \neq k$. The $x_i$ values are, however, constrained to be between the predetermined limits; hence, no $x_i$ will be increased above the upper bound or decreased below 0. The amount by which the $x_i$ are incremented or decremented may be a constant or it may depend on the current value of $x_i$. In the preferred embodiment of the present invention a table of $x_i$ values having 7 possible $x_i$ values is used. If an $x_i$ is to be increased, its value is changed to the next higher value in the table if there is such a value. Similarly, if the $x_i$ is to be decreased, its value is changed to the next lower value in the table if there is such a value. After an adjustment is made, the counters are set to zero and the process is repeated for the next window time period.

It should be noted that the higher the $x_i$ value, the more difficult it is for another channel to take control of the mixer and become the dominant channel. Hence, even a channel for which $S_i$ is only slightly greater than the $S_i$ values of the other channels can remain the dominant channel. Hence, an inactive microphone is less likely to become active due to bleed-over. When a new dominant channel emerges, the x values of the other channels will be increased to 1 over a period of time that is determined by the window time period. If another channel has a short noise burst, then the x values may shift slightly; however, the previously dominant channel will easily regain its dominance since its x value will have only been partially increased.

While the above embodiments of the present invention have been described in terms of a particular channel signal $S_i$, however, it will be apparent to those skilled in the art that other channel signals may also be used. In general, the channel signal must be a function of both the pre- and post attenuator signal levels and some parameter x. Since the channel signal is a form of feed-back signal, a monotonic function of x is preferred. For example, the level control signals, $L_i$, may be used as channel signals.

Various modifications to the present invention will become apparent to those skilled in the art from the foregoing description and accompanying drawings. Accordingly, the present invention is to be limited solely by the scope of the following claims.

What is claimed is:

1. An audio mixing system comprising:
   a plurality of input channels, each said input channel comprising means for receiving an input signal; and means for generating an attenuated signal from said input signal, the degree of attenuation being specified by a channel control signal corresponding to said channel;
   means for combining all of said attenuated signals to form an output signal; and
   control means for generating said channel control signals, each said channel control signal being responsive to said input signal on said channel, said attenuated signal on said channel, and the value of a parameter x corresponding to said channel, said parameter x corresponding to each said channel defining the relative contribution of said input signal and said attenuated signal in said channel to said channel control signals, wherein said control means further comprises means for periodically selecting one of said channels, said selection depending on said parameter x, said attenuated signal, and said input signal for each said channel, over a preceeding time period and wherein said control means decreases said parameter x corresponding to said selected channel and increases said parameter x corresponding to the remaining channels provided said increases or decreases do not cause x to have a value outside a predetermined range, said increases and decreases being made in response to said periodic determination.

2. The mixing system of claim 1 wherein said means for periodically selecting one of said channels comprises means for generating a signal for each channel, said signal depending on said input signal, said attenuated signal and parameter x for said channel; and means for determining which of said generated signals has the maximum amplitude.

3. The mixing system of claim 1 wherein said signal has a an amplitude given by $P^*(1-x) + A^*x$ for each said input channel, where P is said input signal to said input channel, A is said attenuated signal generated by said input channel.

* * * * *